United States Patent [19]
Hasegawa

[11] Patent Number: 5,986,288
[45] Date of Patent: Nov. 16, 1999

[54] EPITAXIAL WAFER FOR A LIGHT-EMITTING DIODE AND A LIGHT-EMITTING DIODE

[75] Inventor: Koichi Hasegawa, Chichibu, Japan

[73] Assignee: Showa Denko K.K., Tokyo, Japan

[21] Appl. No.: 09/030,359

[22] Filed: Feb. 25, 1998

[30]  Foreign Application Priority Data

Feb. 27, 1997  [JP]  Japan .................................. 9-044187

[51] Int. Cl.$^6$ .................................................. H01L 33/00
[52] U.S. Cl. .............................. 257/94; 257/13; 257/86; 257/101; 438/47; 117/13; 117/19; 117/17; 117/21
[58] Field of Search ............................ 257/86, 94, 101; 438/47; 117/13, 19, 17, 21

[56]  References Cited

U.S. PATENT DOCUMENTS

| | | | |
|---|---|---|---|
| 4,303,464 | 12/1981 | Suzuki et al. ............................ | 156/605 |
| 4,378,259 | 3/1983 | Hasegawa et al. ....................... | 148/175 |
| 5,442,201 | 8/1995 | Adomi et al. ............................. | 257/86 |
| 5,707,891 | 1/1998 | Izumi et al. ............................. | 437/120 |

Primary Examiner—Olik Chaudhuri
Assistant Examiner—Douglas A. Wille
Attorney, Agent, or Firm—Armstrong, Westerman, Hattori, McLeland & Naughton

[57]  ABSTRACT

An epitaxial wafer for a light-emitting diode includes an n-type GaP single-crystal substrate, and at least an n-type semiconductor epitaxial layer and a p-type semiconductor epitaxial layer formed on the substrate. The substrate has a boron concentration of not more than $1\times10^{17}$ cm$^{-3}$. A light-emitting diode is fabricated using the epitaxial wafer thus formed provided with electrodes.

14 Claims, 5 Drawing Sheets

EPITAXIAL WAFER FOR A LIGHT-EMITTING DIODE AND A LIGHT-EMITTING DIODE

BACKGROUND OF THE INVENTION

1. Field of the Invention

The present invention relates to an epitaxial wafer for a GaP, GaAs, or AlGaInP light-emitting diode and to a light-emitting diode fabricated using said epitaxial wafer.

2. Description of the Prior Art

The low power consumption and long life of light-emitting diodes (LEDs) that emit visible light have brought them into widespread use as a light source in various display devices and the like. In recent years technical innovation that has increased the brightness of LEDs and the introduction of new crystal materials that enable the emission of diverse colors have led to a further expansion in the range of applications and the numbers of LEDs in use. Among such LEDs, those using a GaP single-crystal substrate include GaP, GaAs and AlGaInP LEDs.

There are three types of GaP LEDs, categorized according to whether they emit red light, yellow green light, or green light. Each type is fabricated by the liquid phase epitaxial growth method. Since GaP is an indirect transition type semiconductor, in the case of red light or yellow green light LEDs, high brightness is obtained by the introduction of an emission center.

In structure, red light LEDs are comprised of an n-type GaP single-crystal substrate on which are grown an n-type GaP epitaxial layer and a p-type GaP epitaxial layer doped with zinc and oxygen. The Zn—O pair in the p-type GaP epitaxial layer forms the emission center, emitting red light having a wavelength in the order of 700 nm.

A yellow green LED comprises an n-type GaP single-crystal substrate on which, if required, first an n-type GaP buffer layer is formed, followed by the formation of an n-type GaP epitaxial layer, and, as the emission center, a nitrogen doped n-type GaP epitaxial layer, and a p-type GaP epitaxial layer, to form an LED that emits yellow green light having a wavelength in the order of 570 nm.

A green LED comprises an n-type GaP single-crystal substrate on which, if required, first an n-type GaP buffer layer is formed, followed by the formation of an n-type GaP epitaxial layer not doped with nitrogen, and a p-type GaP epitaxial layer. Since the LED therefore has no emission center, it is not as bright as the yellow green LED described above. The LED emits green light having a wavelength in the order of 555 nm.

GaAsP LEDs are fabricated by the vapor phase epitaxial growth method. GaP and GaAsP have different lattice constants, so first vapor phase epitaxy is used to grow an n-type GaAsP compositional gradient layer on the n-type GaP single-crystal substrate, and this is followed by the formation of an n-type GaAsP layer having a constant composition, grown by the same vapor phase epitaxy. A p-n junction is then formed by the diffusion of zinc on the surface of the n-type GasP constant composition layer. By adjusting the As and P component contents in the n-type GaAsP constant composition layer, emission ranging in color from red (in the order of 660 nm) through orange (in the order of 610 nm) to yellow (in the order of 590 nm) may be obtained. With a high P content the semiconductor becomes a indirect transition type, in which case doping with nitrogen as the emission center is used to achieve an increase in emission brightness.

AlGaInP LEDs are usually formed by the metal organic chemical vapor deposition (MOCVD) method. In most cases a GaAs single-crystal substrate is used, but it is also possible to use a GaP single-crystal substrate. Because GaAs has a smaller bandgap than the AlGaInP comprising the active layer, it absorbs emitted light. However, GaP has a larger bandgap than AlGaInP, and therefore does not absorb the emitted light. It is therefore more advantageous to use a GaP substrate, since the fact that the portion of the light emitted by the active layer that is emitted on the substrate side is not absorbed means that brighter emission is obtained.

When a GaP substrate is used, since GaP and AlGaInP have different lattice constants, the MOCVD method is used to form, first, an InGaP, AlGaInP or AlInP compositional gradient layer, then an n-type AlGaInP cladding layer, an AlGaInP active layer, a p-type AlGaInP cladding layer and, if required, a contact layer or window layer. AlInP may be used for the cladding layer. The crystal of contact or window layer may be formed of GaAs, GaAlAs, GaP or the like. Moreover, vapor phase epitaxy or another such method may be used instead of MOCVD to form these layers. By adjusting the composition of the crystal components of the AlGaInP active layer, emission ranging in color from red, in the order of 640 nm, through orange and yellow to green, in the range of 550 nm, may be obtained.

The above GaP, GaAsP and AlGaInP LEDs are each fabricated using an n-type GaP single-crystal substrate doped with Te, Si or the like. However, even when the same process is used to form n-type and p-type epitaxial layers on substrates having the same dopants and the same carrier concentration, there will sometimes be variations in the brightness of the LEDs obtained. As far as is known, the cause was not elucidated.

Although the brightness of such LEDs has been improved through recent improvements in technology, the market is demanding still higher brightnesses. At the same time, with the increasing use of large numbers of LEDs to form large displays, there is also an increasing demand for lower variation in brightness.

The object of the present invention is to provide an epitaxial wafer for a light-emitting diode and a light-emitting diode using the wafer having high brightness and low variation in brightness.

SUMMARY OF THE INVENTION

The invention achieves the foregoing object by providing an epitaxial wafer for a light-emitting diode comprising an n-type GaP single-crystal substrate having a boron concentration of not more than $1 \times 10^{17}$ cm$^{-3}$ more preferably not more than $5 \times 10^{16}$ cm$^{-3}$, and at least an n-type semiconductor epitaxial layer and a p-type semiconductor epitaxial layer formed on the substrate.

The object is also attained by a light-emitting diode comprising the above epitaxial wafer, an electrode of a first conductivity provided on a rear surface of the single-crystal substrate of the wafer and an electrode of a second conductivity provided on a front surface of the p-type semiconductor epitaxial layer.

The n-type semiconductor epitaxial layer and p-type semiconductor epitaxial layer may be favorably used for an epitaxial wafer for a GaP, GaAsP or AlGaInP light-emitting diode and for a light-emitting diode.

Previously, even when epitaxial wafers have been fabricated using the same processes to form n-type and p-type epitaxial layers on single-crystal substrates having the same dopants and the same carrier concentration, there have been variations in the brightness of the resultant LEDs. However, keeping the boron concentration in the substrate to not more than the foregoing $1\times10^{17}$ cm$^{-3}$ makes it possible to obtain light-emitting diodes with improved brightness and lower variations in brightness.

The above and other objects and features of the present invention will become apparent from the following description made with reference to the drawings.

DESCRIPTION OF THE PREFERRED EMBODIMENT

Figure 1:
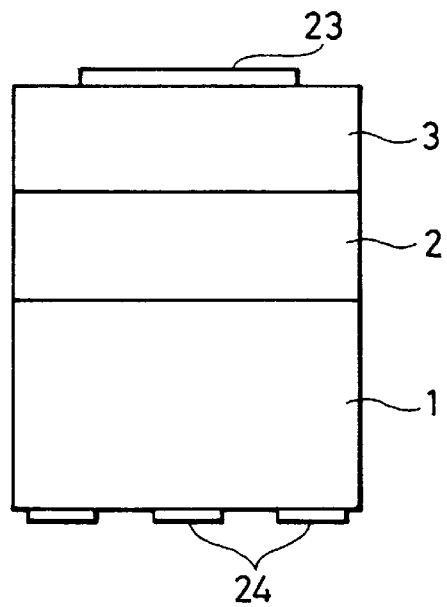
FIG. 1 is a schematic diagram showing the structure of a GaP red light LED according to a first embodiment of the invention.

The present inventors studied how to achieve higher brightness and lower variation in brightness, starting with GaP red light LEDs. It was found that even when epitaxial wafers were fabricated using the same processes to form n-type and p-type GaP epitaxial layers on n-type GaP single-crystal substrates having the same dopants and the same carrier concentration, there were major variations in the brightness of LEDs made from different wafers. An investigation revealed that in most cases the cause was variations among production lots of n-type GaP single crystal.

Detailed studies into the relationship between brightness and the various substances in the n-type GaP single-crystal substrate revealed that there was a correlation between the boron concentration of an n-type GaP single-crystal substrate and the brightness. Namely, when the same process was used to fabricate epitaxial wafers by forming n-type and p-type GaP epitaxial layers on n-type GaP single-crystal substrates having the same carrier concentration but different boron concentrations, and the relationship between the brightness of the LEDs obtained and the boron concentration in the n-type GaP single-crystal substrate was investigated, it was found that LEDs having improved brightness and lower variations in brightness could be obtained with a boron concentration of not more than $1\times10^{17}$ cm$^{-3}$, more preferably not more than $5\times10^{16}$ cm$^{-3}$.

The relationship between brightness and boron concentration in the substrate was then investigated with respect to the n-type GaP single-crystal used as the substrate in GaP based yellow green LEDs, GaP based green LEDs, GaAsP based LEDs and AlGaInP based LEDs. The results again showed that in each case, by using n-type GaP single-crystal substrates having a boron concentration of not more than $1\times10^{17}$ cm$^{-3}$, more preferably not more than $5\times10^{16}$ cm$^{-3}$, LEDs could be obtained having improved brightness and low variations in brightness, even among different production lots. Secondary ion mass spectrometry (SIMS) was used to measure the boron concentration in the n-type GaP single-crystal substrates.

N-type GaP single-crystal substrates are generally formed using n-type GaP single-crystal grown by the Liquid Encapsulated Czochralski (LEC) method. The LEC method uses $B_2O_3$ as the sealing material, and in the GaP single crystal production process the $B_2O_3$ can produce boron through reduction by carbon in jigs and impurities in the crystal growing apparatus, and the boron thus formed can easily get mixed into the GaP single crystal, raising the boron concentration above $10^{17}$ cm$^{-3}$. In order to keep the boron concentration to not more than $10^{17}$ cm$^{-3}$, it is necessary to select suitable conditions under which to grow the single crystal that ensure that less boron is included.

More specifically, methods of reducing the boron include raising the concentration of the moisture content in the $B_2O_3$. That is, the moisture content of the $B_2O_3$ has the effect of reoxidizing to $B_2O_3$ the boron produced by the reduction process described above, so the boron in the GaP single crystal can be reduced by increasing the concentration of the moisture content of the $B_2O_3$. However, if the moisture content of the $B_2O_3$ becomes too high, over 1,000 ppm, for example, it can give rise to unintended chemical reactions having undesirable consequences, such as rendering the $B_2O_3$ opaque. Thus, it is desirable to control the moisture content in the $B_2O_3$ to not more than 1,000 ppm. Boron in the GaP single crystal can also be reduced by adding trace amounts of oxides such as $P_2O_5$ and $Ga_2O_3$ to the $B_2O_3$ to reoxidize to $B_2O_3$ the boron produced through reduction.

Boron is gradually incorporated during the GaP single-crystal formation process, so the boron in the GaP single crystal can also be reduced by reducing the holding time prior to initiating drawing for growing the GaP single crystal or by increasing the draw rate. However, the concentration of the moisture content in the $B_2O_3$, the holding time prior to initiating drawing of the GaP single crystal and the draw rate affect other properties of the crystal as well as the boron concentration. Consequently the method used should be selected based on a consideration of the effect on the other properties of the GaP single crystal, or a combination of methods should be used, to control the boron concentration in the crystal to not more than $1\times10^{17}$ cm$^{-3}$, more preferably to not more than $5\times10^{16}$ cm$^{-3}$ The invention is described in detail below with reference to embodiments. However, the invention is not limited to these embodiments.

First Embodiment

Embodiments of the invention will be described starting with the example of a GaP based red light LED. FIG. 1 is a schematic diagram showing the structure of the GaP red light LED fabricated in accordance with this first embodiment. In FIG. 1, reference numeral 1 denotes an n-type GaP single-crystal substrate, 2 an n-type GaP epitaxial layer, 3 a p-type GaP epitaxial layer doped with zinc and oxygen, 23 a p-type electrode and 24 an n-type electrode. The n-type GaP single-crystal substrate 1 was a Te doped GaP single-crystal substrate fabricated by the LEC method, with a carrier concentration of $2\times10^{17}$ cm$^{-3}$ and the surface orientation as (111)B. The n-type GaP single-crystal substrate 1 was fitted into an ordinary slide boat substrate holder. The prescribed amount of the solution for the epitaxial growth consisting of metallic Ga and GaP polycrystal, with Si as the dopant, was placed in the solution crucible and, with the substrate and growth solution separated, the slide boat was inserted into a growth furnace to heat the solution to 1,000° C. in streaming hydrogen and maintained at that temperature for one hour until the GaP polycrystal was melted and saturated in the metallic Ga. The substrate holder was then slid to bring the substrate 1 into contact with the epitaxial growth solution, which was then slowly cooled to 800° C. to thereby grow a Si doped n-type GaP epitaxial layer 2 on the substrate 1. After completion of the growth, the substrate holder was slid to separate the substrate 1 with the n-type GaP epitaxial layer 2 from the epitaxial growth solution, and after cooling to room temperature the substrate 1 with the n-type GaP epitaxial layer 2 was removed from the apparatus.

The substrate 1 with the n-type GaP epitaxial layer 2 was then fitted into the slide boat substrate holder, and the prescribed amount of the solution for the epitaxial growth consisting of metallic Ga, GaP polycrystal, Zn and $Ga_2O_3$ was placed in the solution crucible. The slide boat was then inserted into a growth furnace to heat the solution to 1,000° C. in streaming hydrogen and maintained at that temperature for one hour until the GaP polycrystal melted in the metallic Ga and saturated. The substrate holder was then slid to bring the n-type GaP epitaxial layer 2 on the substrate 1 into contact with the epitaxial growth solution, which was then heated to 1,005° C. to partially dissolve the surface of the n-type GaP epitaxial layer 2, and gradually cooled to 950° C. to form a Zn and O doped p-type GaP epitaxial layer 3 on the n-type GaP epitaxial layer 2. After completion of the growth, the substrate holder was slid to separate the substrate 1 with the n-type GaP epitaxial layer 2 and p-type GaP epitaxial layer 3 from the epitaxial growth solution, and was cooled to room temperature, thereby obtaining an epitaxial wafer for a GaP red light LED. A p-type electrode 23 of AuBe and an n-type electrode 24 of AuGe were then formed on the p-type GaP epitaxial layer 3 and on the rear surface of the substrate 1, respectively, by vapor deposition, heat treatment and photolithography. The wafer was then separated into individual diodes to obtain the light-emitting diode shown in FIG. 1.

Figure 2:
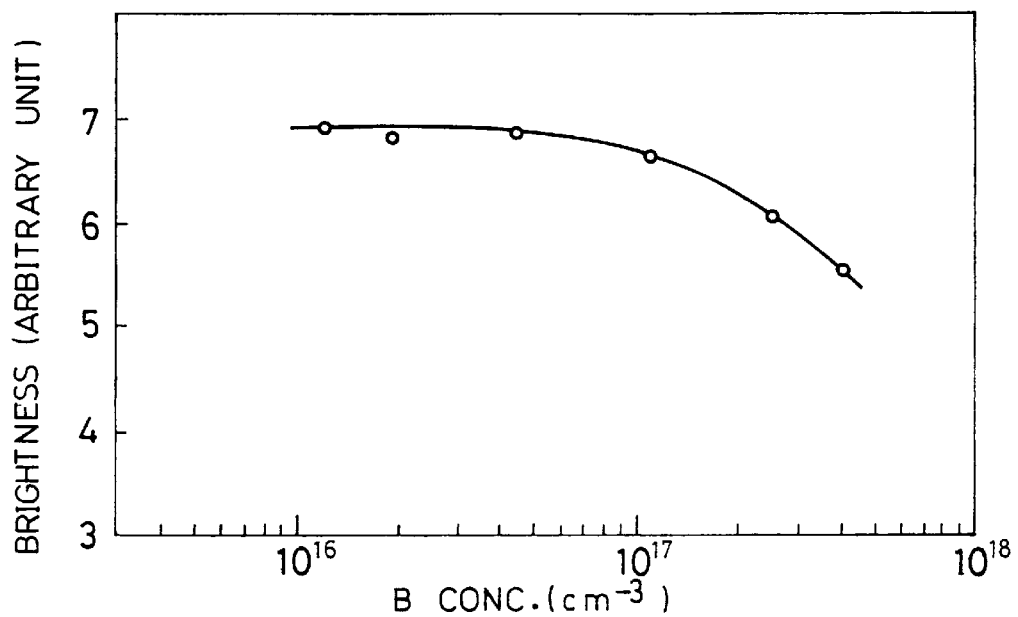
FIG. 2 is a graph showing the relationship between the boron concentration in the substrate and the brightness of the light-emitting diode of FIG. 1.

$B_2O_3$ sealing agents having three different moisture contents of approximately 600 ppm, 800 ppm and 1,000 ppm were used and the crystal growth conditions controlled to fabricate n-type GaP single-crystal substrates with boron concentrations of approximately $4.5\times10^{16}$ cm$^{-3}$, $2\times10^{16}$ cm$^{-3}$, and $1.2\times10^{16}$ cm$^{-3}$. These substrates were then used to form GaP red light LEDs by means of the process described above. FIG. 2 shows the relationship between the n-type GaP single-crystal substrate boron concentration and brightness of the GaP red light LEDs thus obtained.

First Comparative Example

For comparison, without adjusting the moisture content of the $B_2O_3$ sealing agent, crystal growth conditions and so forth were controlled to fabricate n-type GaP single-crystal substrates with boron concentrations of approximately $1.2\times10^{17}$ cm$^{-3}$, $2.7\times10^{17}$ cm$^{-3}$, and $4\times10^{17}$ cm$^{-3}$, and these substrates were then used to form epitaxial wafers for GaP red light LEDs by means of the same process used in the first embodiment, on which electrodes were then formed and the wafer cut to form the individual GaP LEDs. FIG. 2 shows the relationship between the n-type GaP single-crystal substrate boron concentration and brightness of the GaP red light LEDs thus obtained.

FIG. 2 reveals that the LED brightness starts to decrease when the boron concentration in the n-type GaP single-crystal substrate exceeds $1\times10^{17}$ cm$^{-3}$, and that a boron concentration that does not exceed $1\times10^{17}$ cm$^{-3}$, and more preferably does not exceed $5\times10^{16}$ cm$^{-3}$, results in LEDs having stable, high brightness. Furthermore, to measure variations in the brightness, the epitaxial wafers fabricated in accordance with the first embodiment using n-type GaP single-crystal substrates with one of three boron concentrations not exceeding $1\times10^{17}$ cm$^{-3}$ were used to fabricate 100 LEDs at each concentration, for a total of 300 LEDs. The standard deviation $\sigma_{n-1}$ was 0.16. In contrast, the standard deviation $\sigma_{n-1}$ measured with respect to 300 LEDs, 100 at each concentration, formed using the epitaxial wafers fabricated in accordance with the first comparative example, was 0.43. That is, it was possible to reduce variations in the brightness of GaP red light LEDs by keeping the boron concentration in the n-type GaP single-crystal substrates to not more than $1\times10^{17}$ cm$^{-3}$.

Second Embodiment

Figure 3:
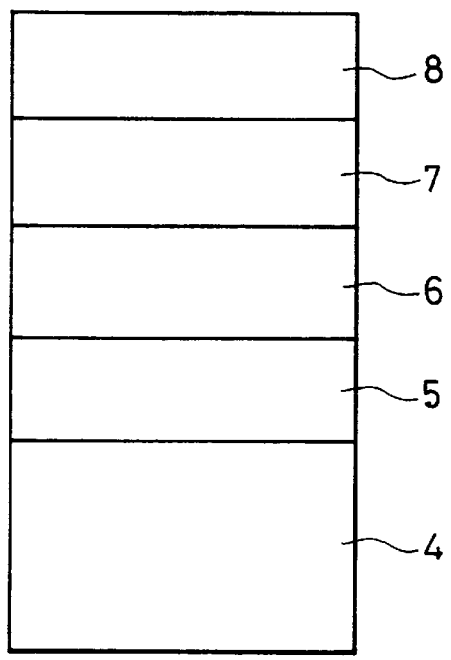
FIG. 3 is a schematic diagram showing the structure of an epitaxial wafer of a GaP yellow green light LED according to a second embodiment of the invention.

FIG. 3 is a schematic diagram showing the structure of an epitaxial wafer for a GaP yellow green light LED fabricated in accordance with this second embodiment. In FIG. 3, reference numeral 4 denotes an n-type GaP single-crystal substrate, 5 an n-type GaP buffer layer, 6 a silicon doped n-type GaP epitaxial layer, 7 a nitrogen doped n-type GaP epitaxial layer, and 8 a p-type GaP epitaxial layer. The n-type GaP single-crystal substrate 4 was a Te doped GaP single-crystal substrate fabricated by the Liquid Encapsulated Czochralski (LEC) method, with a carrier concentration of $2\times10^{17}$ cm$^{-3}$ and the surface orientation as (111)B. A standard liquid phase epitaxial growth method was used to grow the n-type GaP buffer layer 5 on the n-type GaP single-crystal substrate 4. The n-type GaP buffer layer 5 was doped with silicon, had a carrier concentration of $4\times10^{17}$ cm$^{-3}$ and a thickness of 100 μm.

The n-type GaP single-crystal substrate 4 with the n-type GaP buffer layer 5 was fitted into an ordinary horizontal slide boat substrate holder and the prescribed amount of the metallic Ga forming the epitaxial growth solution was placed in the solution crucible. With the substrate and metallic Ga separated, the slide boat was inserted into a growth furnace and heated to 1,000° C. in streaming hydrogen. The substrate holder was then slid to bring the surface of the n-type GaP buffer layer 5 into contact with the metallic Ga and the state maintained for one hour until the n-type GaP buffer layer 5 partially melted and saturated into the metallic Ga. At that point, the silicon contained as dopant in the melted portion of the n-type GaP buffer layer 5, and silicon produced in the furnace by reduction of the quartz of the reaction tube with the hydrogen, melt in the metallic Ga. The temperature was then slowly reduced to 960° C., forming silicon doped n-type GaP epitaxial layer 6 on the n-type GaP buffer layer 5. While maintaining the temperature at 960° C., the atmosphere was changed from hydrogen to argon gas containing a prescribed amount of ammonia gas. When this is done, the ammonia gas reacts with the Ga solution, thereby incorporating nitrogen in the Ga solution. The temperature was then slowly reduced to 900° C. to thereby grow a nitrogen doped n-type GaP epitaxial layer 7 on the Si doped n-type GaP epitaxial layer 6. Next, while maintaining the temperature at 900° C., zinc vapor was supplied to the atmospheric gas to incorporate a prescribed amount of zinc in the Ga solution. The temperature was again slowly reduced to 800° C. to grow a zinc doped p-type GaP epitaxial layer 8 on the nitrogen doped n-type GaP epitaxial layer 7. After completion of the growth process, the substrate holder was slid away from the epitaxial growth solution and the temperature reduced to room temperature, to thereby obtain an epitaxial wafer for a GaP yellow green LED.

Figure 4:
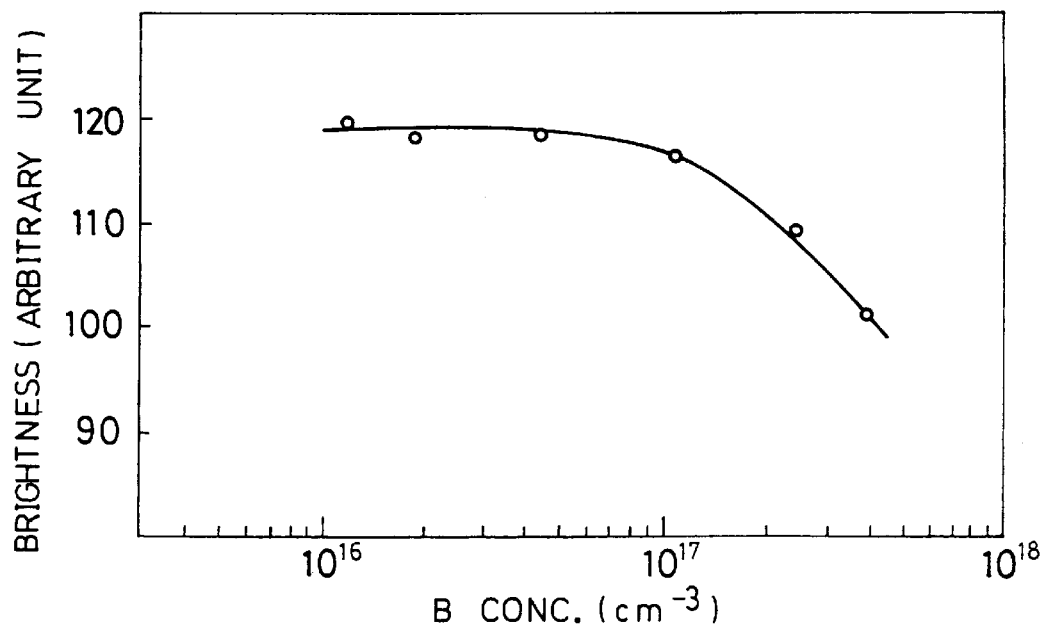
FIG. 4 is a graph showing the relationship between the boron concentration in the substrate and the brightness of a light-emitting diode fabricated using the epitaxial wafer of FIG. 3.

As in the first embodiment, the moisture content of the $B_2O_3$ used when growing the GaP single crystal was increased and the crystal growth conditions controlled to fabricate n-type GaP single-crystal substrates with three different boron concentrations not exceeding $1 \times 10^{17}$ $cm^{-3}$. These substrates were then used to form epitaxial wafers for GaP yellow green light LEDs by means of the process described above. A p-type electrode was then formed on the p-type GaP epitaxial layer 8 and an n-type electrode on the rear surface of the single-crystal substrate 4, and the wafer cut to form the individual GaP LEDs as in the first embodiment. FIG. 4 shows the relationship between the n-type GaP single-crystal substrate boron concentration and brightness of the GaP yellow green light LEDs thus obtained.

Second Comparative Example

As in the first comparative example, for comparison, n-type GaP single-crystal substrates having three levels of boron concentration, each not less than $1 \times 10^{17}$ $cm^{-3}$, were fabricated and used to fabricate epitaxial wafers for GaP yellow green LEDs, and the GaP LEDs were then fabricated as described with respect to the second embodiment. FIG. 4 also shows the relationship between the n-type GaP single-crystal substrate boron concentration and brightness in the case of the GaP yellow green light LEDs thus obtained. FIG. 4 reveals that high-brightness LEDs were obtained when the boron concentration in the n-type GaP single-crystal substrate did not exceed $1 \times 10^{17}$ $cm^{-3}$, and more preferably did not exceed $5 \times 10^{16}$ $cm^{-3}$. Regarding variations in brightness, GaP yellow green LEDs with a substrate boron concentration not exceeding $1 \times 10^{17}$ $cm^{-3}$ showed a standard deviation $\sigma_{n-1}$ of 2.27. In contrast, n-type GaP yellow green LEDs formed using substrates having a boron concentration exceeding $1 \times 10^{17}$ $cm^{-3}$ had a standard deviation $\sigma_{n-1}$ of 6.54. Thus, it was possible to reduce variations in the brightness of GaP yellow green light LEDs by keeping the boron concentration in the n-type GaP single-crystal substrates to not more than $1 \times 10^{17}$ $cm^{-3}$.

Third Embodiment

Figure 5:
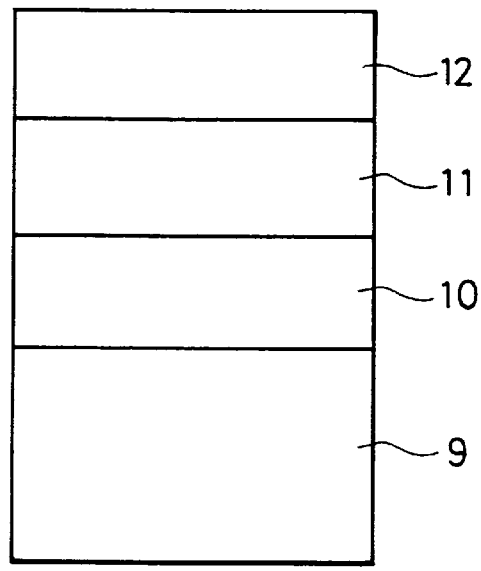
FIG. 5 is a schematic diagram showing the structure of an epitaxial wafer of a GaP green light LED according to a third embodiment of the invention.

Next, a third embodiment will be described with reference to the example of a GaP green light LED. FIG. 5 is a schematic diagram showing the structure of an epitaxial wafer for a GaP green light LED fabricated in accordance with this third embodiment. In FIG. 5, reference numeral 9 denotes an n-type GaP single-crystal substrate, 10 an n-type GaP buffer layer, 11 a S doped n-type GaP epitaxial layer, and 12 a p-type GaP epitaxial layer. The n-type GaP single-crystal substrate 9 was a Te doped GaP single-crystal substrate fabricated by the Liquid Encapsulated Czochralski (LEC) method, with a carrier concentration of $2 \times 10^{17}$ $cm^{-3}$ and the surface orientation as (111)B. A standard liquid phase epitaxial growth method was used to grow the n-type GaP buffer layer 10 on the n-type GaP single-crystal substrate 9. The n-type GaP buffer layer 10 was doped with silicon, had a carrier concentration of $4 \times 10^{17}$ $cm^{-3}$ and a thickness of 60 $\mu$m.

The n-type GaP single-crystal substrate 9 with the n-type GaP buffer layer 10 was fitted into an ordinary horizontal slide boat substrate holder. Epitaxial growth solution for forming the S doped n-type GaP epitaxial layer 11 consisting of a prescribed amount of metallic Ga and prescribed amounts of GaP polycrystal and $Ga_2S_3$ as the S source was placed in a first solution crucible, and epitaxial growth solution for forming the p-type GaP epitaxial layer 12 consisting of a prescribed amount of metallic Ga and GaP polycrystal was place in a second solution crucible. With the substrate and epitaxial growth solution separated, the slide boat was inserted into the epitaxial growth furnace, heated to 1,000° C. in streaming hydrogen, and maintained at that temperature for one hour until the GaP polycrystal melted and saturated in the metallic Ga.

The substrate holder was then slid to bring the surface of the n-type GaP buffer layer 10 into contact with the solution in the first crucible and the temperature was slowly cooled to 900° C., forming the S doped n-type GaP epitaxial layer 11 on the n-type GaP buffer layer 10. While maintaining the temperature at 900° C., the substrate holder was slid to bring the surface of the S doped n-type GaP epitaxial layer 11 into contact with the solution in the second crucible, and after adding Zn vapor to the streaming hydrogen to incorporate a prescribed amount of Zn into the growth solution, the temperature was slowly cooled to 800° C. to form the p-type GaP epitaxial layer 12 on the S doped n-type GaP epitaxial layer 11. After completion of the growth process, the substrate holder was slid away from the epitaxial growth solution and the temperature reduced to room temperature, to thereby obtain an epitaxial wafer for a GaP green LED.

Figure 6:
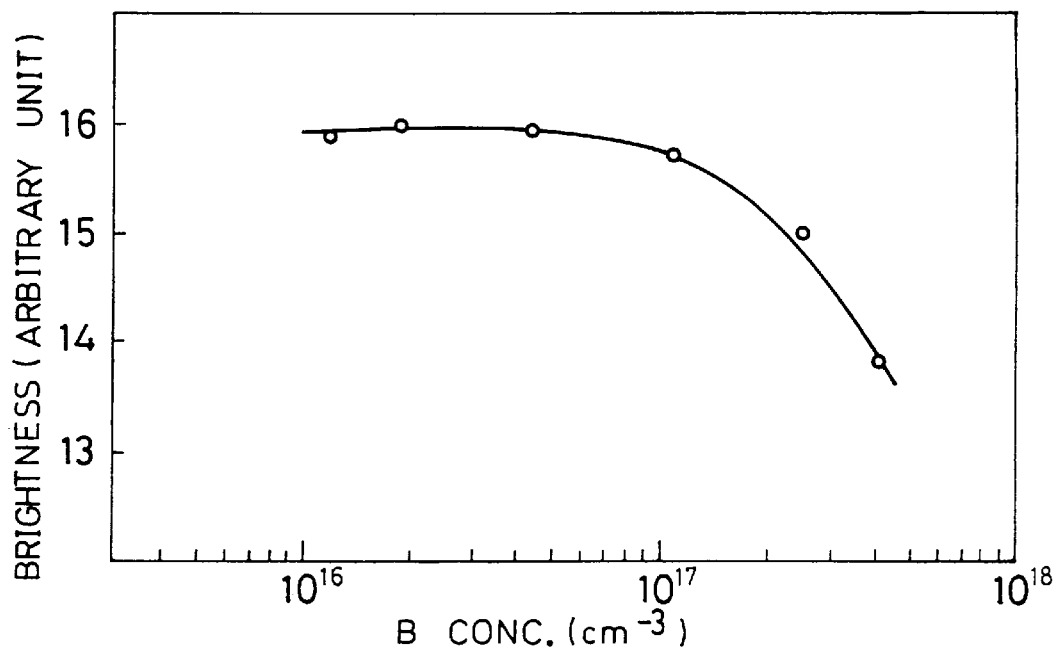
FIG. 6 is a graph showing the relationship between the boron concentration in the substrate and the brightness of a light-emitting diode fabricated using the epitaxial wafer of FIG. 5.

As in the first embodiment, the moisture content of the $B_2O_3$ used when growing the GaP single crystal was increased and the crystal growth conditions controlled to fabricate n-type GaP single-crystal substrates with three different boron concentrations not exceeding $1 \times 10^{17}$ $cm^{-3}$. These substrates were then used to form epitaxial wafers for GaP green light LEDs by means of the process described above. A p-type electrode was then formed on the p-type GaP epitaxial layer 12 and an n-type electrode on the rear surface of the n-type GaP single-crystal substrate 9 as in the first embodiment, and the wafer was cut to form the individual GaP based green light LEDs. FIG. 6 shows the relationship between the n-type GaP single-crystal substrate boron concentration and brightness of the GaP green light LEDs thus obtained.

Third Comparative Example

As in the first comparative example, for comparison, without adjusting the moisture content of the sealing agent, n-type GaP single-crystal substrates having three levels of boron concentration, each not less than $1 \times 10^{17}$ $cm^{-3}$, were fabricated by controlling crystal growth conditions and so forth and used to fabricate epitaxial wafers for GaP green LEDs by means of the process described above, and the GaP LEDs were then fabricated as described with respect to the third embodiment. FIG. 6 also shows the relationship between the n-type GaP single-crystal substrate boron concentration and brightness in the case of the GaP green light LEDs thus obtained. FIG. 6 reveals that high-brightness LEDs were obtained when the boron concentration in the n-type GaP single-crystal substrate did not exceed $1 \times 10^{17}$ $cm^{-3}$, and more preferably did not exceed $5 \times 10^{16}$ $cm^{-3}$.

9

Regarding variations in brightness, green light LEDs with a n-type GaP single-crystal substrate boron concentration not exceeding $1 \times 10^{17}$ cm$^{-3}$ showed a standard deviation $\sigma_{n-1}$ of 0.34. In contrast, green LEDs formed using substrates having a boron concentration exceeding $1 \times 10^{17}$ cm$^{-3}$ had a standard deviation $\sigma_{n-1}$ of 1.01. Thus, it was possible to reduce variations in the brightness of GaP green light LEDs by keeping the boron concentration in the n-type GaP single-crystal substrate to not more than $1 \times 10^{17}$ cm$^{-3}$.

Fourth Embodiment

Figure 7:
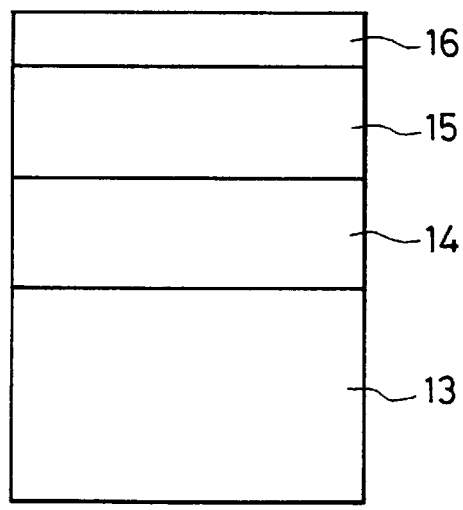
FIG. 7 is a schematic diagram showing the structure of an epitaxial wafer of a GaAsP orange light LED according to a fourth embodiment of the invention.

Next, a fourth embodiment will be described with reference to the example of a GaAsP LED. FIG. 7 is a schematic diagram showing the structure of an epitaxial wafer for a GaAsP LED fabricated in accordance with this fourth embodiment. In FIG. 7, reference numeral 13 denotes an n-type GaP single-crystal substrate, 14 an n-type GaAs$_x$P$_{1-x}$ compositional gradient layer, 15 an n-type GaAs$_x$P$_{1-x}$ constant composition layer, and 16 a Zn diffused p-type layer. The n-type GaP single-crystal substrate 13 was a Te doped GaP single-crystal substrate fabricated by the Liquid Encapsulated Czochralski (LEC) method, with a carrier concentration of $2 \times 10^{17}$ cm$^{-3}$ and the surface orientation as (100) tilted 5° toward <110>.

The n-type GaP single-crystal substrate 13 and a quartz vessel containing metallic Ga were placed at a specified position in a standard vapor phase epitaxial growth reaction furnace, and the n-type GaP single-crystal substrate 13 and quartz vessel containing the metallic Ga were heated to prescribed temperatures in streaming hydrogen. Next, a flow of HCl gas was introduced into contact with the surface of the metallic Ga, and PH$_3$ diluted in hydrogen, AsH$_3$ diluted in hydrogen and H$_2$S were introduced into the reaction furnace and the n-type GaAs$_x$P$_{1-x}$ compositional gradient layer 14 was grown on the substrate 13. The ratio between the PH$_3$ diluted in hydrogen and the AsH$_3$ diluted in hydrogen was adjusted to provide a continuous gradient in the As x component from x=0 at the start of the growth to x=0.35 at the completion of the growth. Next, the ratio between the PH$_3$ diluted in hydrogen and the AsH$_3$ diluted in hydrogen was fixed to fix x at 0.35, and the n-type GaAs$_x$P$_{1-x}$ constant composition layer 15 was grown on the n-type GaAs$_x$P$_{1-x}$ compositional gradient layer 14. At this same time, a prescribed amount of NH$_3$ gas was introduced into the reaction furnace to dope the n-type GaAs$_x$P$_{1-x}$ constant composition layer 15 with nitrogen.

After completion of the growth process, the substrate 13 with the n-type GaAs$_x$P$_{1-x}$ compositional gradient layer 14 and the n-type GaAs$_x$P$_{1-x}$ constant composition layer 15 was removed from the furnace and a standard method was used to diffuse Zn into the surface of the n-type GaAs$_x$P$_{1-x}$ constant composition layer 15 to form a p-type layer 16, to thereby obtain an epitaxial wafer for a GaAsP based orange light LED. As in the first embodiment, n-type GaP single-crystal substrates were fabricated containing three different boron concentrations not exceeding $1 \times 10^{17}$ cm$^{-3}$, and these substrates were then used to fabricate epitaxial wafers for GaAsP orange light LEDs.

Figure 8:
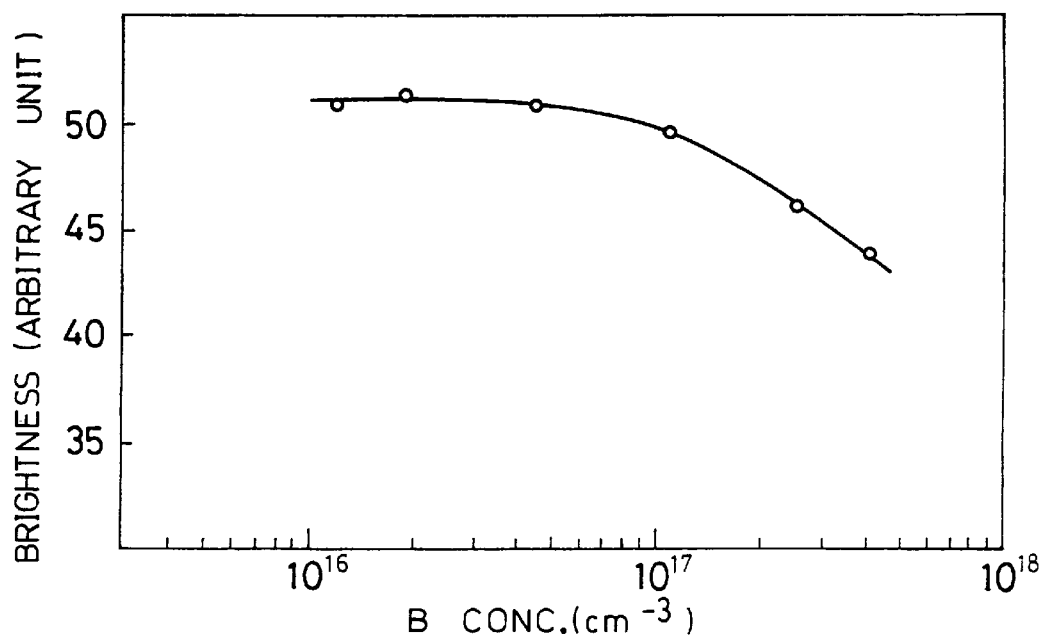
FIG. 8 is a graph showing the relationship between the boron concentration in the substrate and the brightness of a light-emitting diode fabricated using the epitaxial wafer of FIG. 7.

A p-type electrode was then provided on the p-type layer 16 and an n-type electrode on the rear surface of the single-crystal substrate 13 as in the first embodiment and the wafer was divided to obtain individual GaAsP orange light LEDs. FIG. 8 shows the relationship between the n-type GaP single-crystal substrate boron concentration and brightness of the GaAsP orange light LEDs thus obtained.

Fourth Comparative Example

As in the first comparative example, for comparison, n-type GaP single-crystal substrates having three levels of boron concentration, each not less than $1 \times 10^{17}$ cm$^{-3}$, were fabricated and used to fabricate epitaxial wafers for GaAsP orange light LEDs by means of the process described above, and the GaAsP orange light LEDs were then fabricated as described with respect to the fourth embodiment. FIG. 8 also shows the relationship between the n-type GaP single-crystal substrate boron concentration and brightness in the case of the GaAsP orange light LEDs thus obtained. From FIG. 8 it can be seen that high-brightness LEDs were obtained when the boron concentration in the n-type GaP single-crystal substrate did not exceed $1 \times 10^{17}$ cm$^{-3}$, and more preferably did not exceed $5 \times 10^{16}$ cm$^{-3}$. Regarding variations in brightness, the GaAsP orange light LEDs with a substrate boron concentration not exceeding $1 \times 10^{17}$ cm$^{-3}$ showed a standard deviation $\sigma_{n-1}$ of 0.94. In contrast, n-type GaAsP orange light LEDs formed using substrates having a boron concentration exceeding $1 \times 10^{17}$ cm$^{-3}$ had a standard deviation $\sigma_{n-1}$ of 2.97. Thus, it was possible to reduce variations in the brightness of GaAsP orange light LEDs by keeping the boron concentration in the n-type GaP single-crystal substrate to not more than $1 \times 10^{17}$ cm$^{-3}$.

Fifth Embodiment

Figure 9:
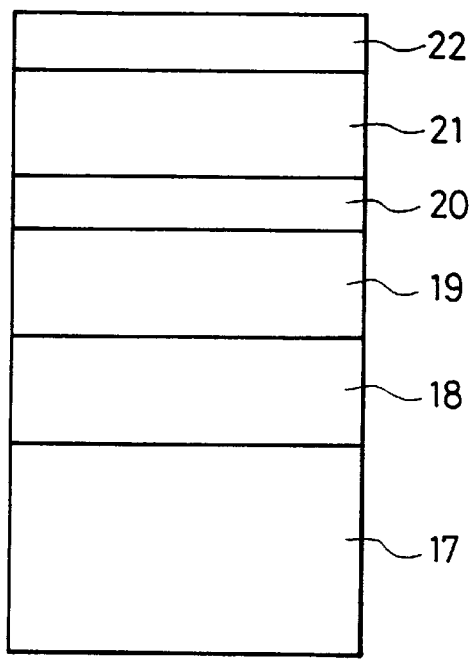
FIG. 9 is a schematic diagram showing the structure of an epitaxial wafer of a AlGaInP orange light LED according to a fifth embodiment of the invention.

Next, a fifth embodiment will be described with reference to the example of an AlGaInP LED. FIG. 9 is a schematic diagram showing the structure of an epitaxial wafer for a AlGaInP light LED fabricated in accordance with this fifth embodiment. In FIG. 9, reference numeral 17 denotes an n-type GaP single-crystal substrate, 18 an n-type Ga$_y$In$_{1-y}$P compositional gradient layer, 19 an n-type (Al$_x$Ga$_{1-x}$)$_y$In$_{1-y}$P cladding layer, 20 an (Al$_x$Ga$_{1-x}$)$_y$In$_{1-y}$P active layer, 21 a p-type (Al$_x$Ga$_{1-x}$)$_y$In$_{1-y}$P cladding layer, and 22 a p-type GaAs contact layer. The n-type GaP single-crystal substrate 17 was a Te doped GaP single-crystal substrate fabricated by the Liquid Encapsulated Czochralski (LEC) method, with a carrier concentration of $2 \times 10^{17}$ cm$^{-3}$ and the surface orientation as (100) tilted 5° toward <110>.

After placing the n-type GaP single-crystal substrate 17 in the susceptor of an MOCVD reaction furnace, the furnace was charged with hydrogen gas and the substrate heated to the prescribed temperature. Using hydrogen as the carrier gas and supplying trimethyl indium (TMI), trimethyl gallium (TMG), phosphine (PH$_3$) and hydrogen selenide (H$_2$Se) as the starting material gases, the n-type Ga$_y$In$_{1-y}$P compositional gradient layer 18 was grown on the n-type GaP single-crystal substrate 17. The flow of the starting material gases was adjusted to produce a continuous gradient in the Ga y component from ranging from y=1 at the start of the growth to y=0.5 at the completion of the growth. Next, trimethyl aluminum (TMA), TMI, TMG, PH$_3$ and H$_2$Se were used as the starting material supply gases to form the n-type (Al$_{0.7}$Ga$_{0.3}$)$_{0.5}$In$_{0.5}$P cladding layer 19 on the n-type compositional gradient layer 18. Next, TMA, TMI, TMG and PH$_3$ were used as the starting material supply gases to form undoped (Al$_{0.2}$Ga$_{0.8}$)$_{0.5}$In$_{0.5}$P active layer 20 on the n-type cladding layer 19. The p-type (Al$_{0.7}$Ga$_{0.3}$)$_{0.5}$In$_{0.5}$P cladding layer 21 was then grown on the undoped active layer 20, using TMA, TMI, TMG, PH$_3$ and dimethyl zinc (DMZ) as the starting material supply gases. Finally, the p-type GaAs contact layer 22 was grown on the p-type cladding layer 21, using TMG, arsine (AsH$_3$) and DMZ as the starting material supply gases, to thereby obtain an epitaxial wafer for AlGaInP orange light LEDs.

Figure 10:
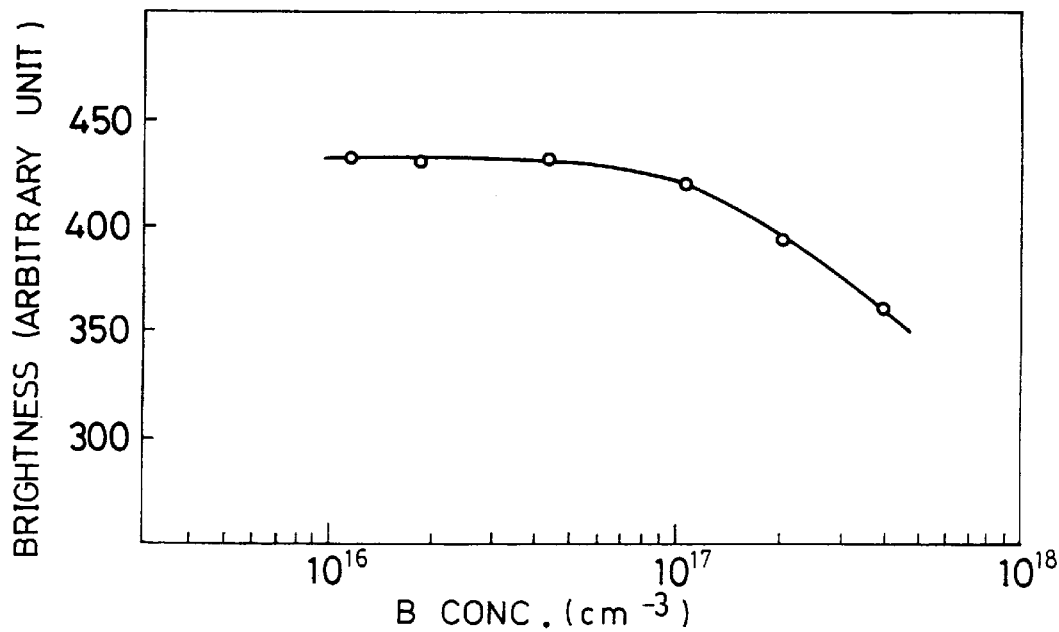
FIG. 10 is a graph showing the relationship between the boron concentration in the substrate and the brightness of a light-emitting diode fabricated using the epitaxial wafer of FIG. 9.

As in the first embodiment, n-type GaP single-crystal substrates were fabricated containing three different boron concentrations not exceeding $1 \times 10^{17}$ cm$^{-3}$, and these substrates were then used to fabricate epitaxial wafers for AlGaInP orange light LEDs by means of the process described above. A p-type electrode was then provided on the p-type GaAs contact layer 22 and an n-type electrode on the rear surface of the single-crystal substrate 18 as in the first embodiment, and the wafer was divided to obtain individual AlGaInP orange light LEDs. FIG. 10 shows the relationship between the n-type GaP single-crystal substrate boron concentration and brightness of the AlGaInP orange light LEDs thus obtained.

Fifth Comparative Example

As in the first comparative example, for comparison, n-type GaP single-crystal substrates having three levels of boron concentration, each not less than $1\times10^{17}$ cm$^{-3}$, were prepared and used to fabricate epitaxial wafers for AlGaInP orange light LEDs by means of the process described above, and the AlGaInP orange light LEDs were then fabricated as described with respect to the fifth embodiment. FIG. 10 also shows the relationship between the n-type GaP single-crystal substrate boron concentration and brightness in the case of the AlGaInP orange light LEDs thus obtained. From FIG. 10 it can be seen that high-brightness LEDs were obtained when the boron concentration in the n-type GaP single-crystal substrate did not exceed $1\times10^{17}$ cm$^{-3}$, and more preferably did not exceed $5\times10^{16}$ cm$^{-3}$. Regarding variations in brightness, AlGaInP orange light LEDs with a substrate boron concentration not exceeding $1\times10^{17}$ cm$^{-3}$ showed a standard deviation $\sigma_{n-1}$ of 7.45. In contrast, AlGaInP orange light LEDs formed using substrates having a boron concentration exceeding $1\times10^{17}$ cm$^{-3}$ had a standard deviation $\sigma_{n-1}$ of 20.9. Thus, it was possible to reduce variations in the brightness of the AlGaInP orange light LEDs by keeping the boron concentration in the n-type GaP single-crystal substrate to not more than $1\times10^{17}$ cm$^{-3}$.

As described in the foregoing, while conventional LEDs exhibit variations in brightness, by controlling the boron concentration in the single-crystal substrate in accordance with this invention, LEDs can be obtained that have a virtually uniform brightness and, in addition, have improved brightness.

What is claimed is:

1. An epitaxial wafer for a light-emitting diode comprising an n-type GaP single-crystal substrate having a boron concentration of not more than $5\times10^{16}$ cm$^{-3}$, and at least an n-type semiconductor epitaxial layer formed on the substrate.

2. The epitaxial wafer according to claim 1, wherein the n-type semiconductor epitaxial layer and p-type semiconductor epitaxial layer are GaP.

3. The epitaxial wafer according to claim 1, wherein the n-type semiconductor epitaxial layer and p-type semiconductor epitaxial layer are GaP.

4. The epitaxial wafer according to claim 1, wherein the n-type semiconductor epitaxial layer and p-type semiconductor epitaxial layer are GaAs$_x$P$_{1-x}$ (0<x<1).

5. The epitaxial wafer according to claim 1, wherein the n-type semiconductor epitaxial layer and p-type semiconductor epitaxial layer are GaAs$_x$P$_{1-x}$ (0<x<1).

6. The epitaxial wafer according to claim 1, wherein the n-type semiconductor epitaxial layer and p-type semiconductor epitaxial layer are (Al$_x$Ga$_{1-x}$)$_y$In$_{1-y}$P (0<x<1,0<y<1).

7. The epitaxial wafer according to claim 1, wherein the n-type semiconductor epitaxial layer and p-type semiconductor epitaxial layer are (Al$_x$Ga$_{1-x}$)$_y$In$_{1-y}$P (0<x<1,0<y<1).

8. A light-emitting diode comprising an n-type GaP single-crystal substrate having a boron concentration of not more than $5\times10^{16}$ cm$^{-3}$, at least an n-type semiconductor epitaxial layer and a p-type semiconductor epitaxial layer formed on the substrate, an electrode of a first conductivity provided on a rear surface of the single-crystal substrate and an electrode of a second conductivity provided on a front surface of the p-type semiconductor epitaxial layer.

9. The light-emitting diode according to claim 8, wherein the n-type semiconductor epitaxial layer and p-type semiconductor epitaxial layer are GaP.

10. The light-emitting diode according to claim 8, wherein the n-type semiconductor epitaxial layer and p-type semiconductor epitaxial layer are GaP.

11. The light-emitting diode according to claim 8, wherein the n-type semiconductor epitaxial layer and p-type semiconductor epitaxial layer are GaAs$_x$P$_{1-x}$ (0<x<1).

12. The light-emitting diode according to claim 8, wherein the n-type semiconductor epitaxial layer and p-type semiconductor epitaxial layer are GaAs$_x$P$_{1-x}$ (0<x<1).

13. The light-emitting diode according to claim 8, wherein the n-type semiconductor epitaxial layer and p-type semiconductor epitaxial layer are (Al$_x$Ga$_{1-x}$)$_y$In$_{1-y}$P (0<x<1, 0<y<1).

14. The light-emitting diode according to claim 8, wherein the n-type semiconductor epitaxial layer and p-type semiconductor epitaxial layer are (Al$_x$Ga$_{1-x}$)$_y$In$_{1-y}$P (0<x<1, 0<y<1).

* * * * *